United States Patent

Hourne et al.

(10) Patent No.: US 10,333,518 B2
(45) Date of Patent: Jun. 25, 2019

(54) DEVICE FOR DETECTING THE PRESENCE OF A USER, DOOR HANDLE COMPRISING SAID DEVICE AND METHOD FOR CONFIGURING THE ASSOCIATED HANDLE

(71) Applicants: CONTINENTAL AUTOMOTIVE FRANCE, Toulouse (FR); CONTINENTAL AUTOMOTIVE GmbH, Hannover (DE)

(72) Inventors: Xavier Hourne, Cugnaux (FR); Cyril Robin, Villeneuve Tolosane (FR); Joel Carniaux, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 1371 days.

(21) Appl. No.: 13/940,895

(22) Filed: Jul. 12, 2013

(65) Prior Publication Data

US 2014/0015640 A1 Jan. 16, 2014

(30) Foreign Application Priority Data

Jul. 13, 2012 (FR) ...................... 12 56757

(51) Int. Cl.
*H03K 17/955* (2006.01)
*H03K 17/96* (2006.01)

(52) U.S. Cl.
CPC ........... *H03K 17/955* (2013.01); *E05B 81/77* (2013.01); *H03K 17/962* (2013.01); *G07C 2209/65* (2013.01); *H03K 2217/960765* (2013.01)

(58) Field of Classification Search
CPC .................................................... B60R 25/10
See application file for complete search history.

(56) References Cited

U.S. PATENT DOCUMENTS

| | | | |
|---|---|---|---|
| 6,348,862 B1 | 2/2002 | McDonnell et al. | |
| 6,847,289 B2 | 1/2005 | Pang et al. | |
| 7,548,210 B2 * | 6/2009 | Hashiguchi et al. | ......... 343/713 |
| 2010/0052700 A1 | 3/2010 | Yano et al. | |
| 2010/0271049 A1 | 10/2010 | Van Gastel et al. | |

FOREIGN PATENT DOCUMENTS

| | | |
|---|---|---|
| CN | 101873126 A | 10/2010 |
| EP | 2372914 A1 | 10/2011 |
| WO | 02/33203 A1 | 4/2002 |

OTHER PUBLICATIONS

French Search Report, dated Mar. 6, 2013, from corresponding French application.

* cited by examiner

*Primary Examiner* — Adnan Aziz
*Assistant Examiner* — Shawna M Kingston
(74) *Attorney, Agent, or Firm* — Young & Thompson

(57) ABSTRACT

A device (D') for detecting presence of a user includes: a connection to the electrical ground (14), an electrode (12), control elements (13') of the electrode, a conducting element (11), connected to the connection (14) to the electrical ground, a first switching element ($I_1$) between the conducting element and the connection to the electrical ground, first element (16) for selecting the position of the first switching element, in order to select the position of the first switching element as a function of the type of coating covering a second exterior surface of a handle into which the device is integrated. The door handle including the device and the associated method for configuring the handle are also described.

8 Claims, 2 Drawing Sheets

DEVICE FOR DETECTING THE PRESENCE OF A USER, DOOR HANDLE COMPRISING SAID DEVICE AND METHOD FOR CONFIGURING THE ASSOCIATED HANDLE

FIELD OF THE INVENTION

The invention relates to a device for detecting the presence of a user, a door handle comprising said device and a method for configuring the associated handle. More particularly, the invention applies to user presence detection devices integrated into a door handle of a automotive vehicle. Such devices detect the approach and/or the contact of a hand of the user toward/on the handle.

BACKGROUND OF THE INVENTION

Nowadays, the handles of vehicle doors are equipped with devices for detecting the presence of a user. The detection of the presence of a user coupled with the recognition of a "hands free" electronic badge for remote control of access carried by this user, allows remote locking and unlocking of the doors of the vehicle. Thus when the user, carrying the corresponding electronic badge and identified by the vehicle, approaches the handle or touches the door handle of his vehicle, the doors of the vehicle are automatically unlocked. By approaching or by pressing on a precise location of the door handle of the vehicle, called the "unlocking zone", the door opens without the necessity to unlock it manually. Conversely, when the user, still carrying the necessary badge and identified by the vehicle, desires to lock his vehicle, he closes the door of his vehicle and he approaches or presses momentarily on another precise location of the handle, called the "locking zone". This action by the user makes it possible to automatically lock the doors of the vehicle.

These presence detection devices generally comprise two capacitive sensors, in the form of two electrodes connected electrically to a printed circuit and integrated into the handle, each in a precise locking or unlocking zone. Generally, one electrode is dedicated to each zone, that is to say one electrode is dedicated to the detection of the approach and/or of the contact of the user's hand in the locking zone and one electrode is dedicated to the detection of the approach and/or the contact of the user's hand in the unlocking zone. One electrode, when it is energized, emits an electric field which defines a detection zone (locking or unlocking zone). The approach of the hand of a user in this detection zone disturbs this electric field and impacts the capacitance seen by said electrode. The measurement of the variation of this capacitance therefore allows the detection of the approach of the user's hand in said zone, in this instance toward the handle. Once this detection has been carried out, it is followed by the dispatching by the capacitive sensor of an unlocking/locking command to the door's unlocking/locking system.

The two zones, locking and unlocking, being situated at distinct locations on the handle, it is necessary that the electric fields emitted by their respective electrodes do not overlap. With this aim, it is known to place a conducting element (for example a copper foil) connected to the electrical ground on the side of the electrode where detection is not desired. This conducting element connected to the ground attracts the electric field emitted by the electrode, and carries out a shielding function in relation to the electric field emitted by said electrode on the side where it is situated.

The space being restricted in a vehicle door handle, it is known to integrate the conducting element and the two electrodes, respectively on each of the two faces of the printed circuit.

With a purely explanatory aim, just a single electrode will be considered, the electrode dedicated to the unlocking zone. A device of the prior art is described with regard to FIGS. 1a, 1b.

In FIG. 1a is represented a door handle 10 of an automotive vehicle (vehicle not represented) in which there is a device D for detecting presence of a user. Said handle 10 comprises a first exterior surface S1 directed toward the door (not represented) and a second exterior surface S2, opposite the first surface and therefore directed to the opposite side, away from the vehicle, more precisely toward the user (not represented). This detection device D comprises an electrode 12 a face of which is situated in proximity to the first exterior surface S1, control means 13 and a conducting element 11 a face of which is situated in proximity to the second exterior surface S2. The electrode 12 and the conducting element 11 are connected to the control means 13. The control means 13 measure the capacitance seen by the electrode 12 in order to detect the presence of a user. The conducting element 11 is connected to the ground by the control means 13 and carries out a shielding function. These control means 13 are for example a printed circuit comprising a microcontroller (not represented). This detection device D defines a detection zone A (which, in the example illustrated in FIG. 1a, is the unlocking zone) situated between the first exterior surface S1 and the door of the vehicle and whose dimensions are estimated in a frame of reference formed by three perpendicular axes X, Y, Z. In the subsequent description, we will consider solely the unlocking electrode 12 dedicated to the unlocking zone A, although the invention can also be applied to the electrode dedicated to the locking zone (not represented). As illustrated in FIG. 1a, we will consider the unlocking zone A to be a zone situated between the handle 10 and the vehicle.

This unlocking zone A is also called "sensitivity" of the detection device D.

This prior art detection device D is known to the person skilled in the art.

There exist various types of door handles 10. As represented in FIG. 1a, certain handles 10 have their second exterior surface S2, covered with a layer of paint P, for example of identical color to that used for the body shell of the vehicle, that is to say with a coating of plastic type. Other handles 10 have their second exterior surface S2 covered, with a purely esthetic aim, with a metallic coating 20, for example covered with a metal comprising chromium (cf. FIG. 1b).

However, the presence of this metallic coating 20 on the second exterior surface S2 disturbs the electric field emitted by the unlocking electrode 12. Indeed, this metallic coating 20 is connected to the electrical ground by way of the vehicle (which is itself electrically grounded), and is conducting. It attracts the electric field of the electrode 12 toward itself and acts as a second shielding element (the first shielding element being the conducting element 11). This is illustrated in FIG. 1b. In the presence of the metallic coating 20 on the second exterior surface S2, the dimensions (in the X, Y, Z frame of reference) of the new unlocking zone A' are markedly smaller than that of the locking zone A obtained with a handle whose second exterior surface S2 is covered with a layer of nonmetallic paint P.

Thus, this metallic coating 20 markedly reduces the dimensions of the unlocking zone A'. The consequence of this is to create a delay in the detection of the presence of the user's hand in the unlocking zone and therefore a delay in the unlocking of the door. In certain cases, this disturbance is such that detection of the presence of the user is then no longer possible. It will be understood that this is not desirable for the user who expects fast unlocking of the doors of his vehicle.

A possible solution to this problem is to increase the range of the electric field emitted by the electrode, by increasing its sensitivity. This solution has, however, the major drawback of increasing the electrical consumption of the detection device, this not being desired, the device operating mainly when the car is stopped and being powered by the battery of the vehicle. A second drawback of this solution is the obligation to have two different detection devices, one for each type of handle coating. However, this diversity of detection devices gives rise to additional costs during the development and production of these detection devices.

BRIEF DESCRIPTION OF THE DRAWINGS

The invention proposes a device for detecting the presence of a user and a method for configuring the associated device making it possible to alleviate this drawback.

More precisely, the invention makes it possible to obtain satisfactory speed of detection of the presence of a user whatever the type of coating of the second exterior surface of the handle, plastic or metallic. Stated otherwise, the invention makes it possible to increase the sensitivity of the detection device, in the case of a metallic coating 20 on the second exterior surface of the handle 10, with respect to the prior art and consequently to be able to use the same detection device whatever the type of coating situated on the handle in which it is situated.

Figure 1A:
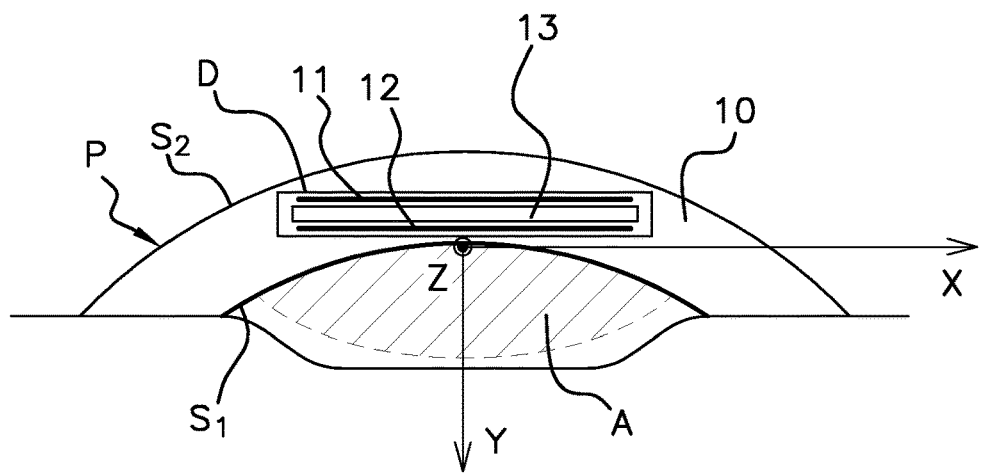

With this aim, the invention proposes a device for detecting presence of a user comprising:
   a connection to the electrical ground,
   an electrode,
   means for control of the electrode,
   a conducting element, connected to the connection to the electrical ground,
according to the invention, the detection device furthermore comprises:
   a first switching means between the conducting element and the connection to the electrical ground, said first switching means having a closed position in which the conducting element is connected to said connection to the electrical ground and an open position in which the conducting element and said connection to the electrical ground are disconnected, and
   first means for selecting the position of the first switching means.
In a second embodiment of the detection device, the latter furthermore comprises:
   a second switching means between the conducting element and the electrode, having a closed position in which the conducting element is connected to the electrode and an open position in which the conducting element and the electrode are disconnected and,
   second means for selecting the position of the second switching means.
The invention also relates to a door handle of a vehicle comprising:
   a detection device comprising the characteristics enumerated hereinabove,
   a first exterior surface directed toward the door,
   a second exterior surface opposite the first exterior surface and covered by a coating,
   in which,
   a face of the electrode is situated in proximity to the first exterior surface,
   a face of the conducting element is situated in proximity to the second exterior surface,
said handle furthermore comprising:
   the position of the first switching means is dependent on the coating covering the second exterior surface.
In a second embodiment of the door handle of a vehicle, the latter comprises:
   a detection device according to the characteristics of the second embodiment of the detection device,
   a first exterior surface directed toward the door,
   a second exterior surface opposite the first exterior surface and covered by a coating,
in which:
   a face of the electrode is situated in proximity to the first exterior surface,
   a face of the conducting element is situated in proximity to the second exterior surface,
according to the invention, said handle is characterized by:
   the position of the first switching means and the position of the second switching means which are functions of the type of coating covering the second exterior surface.
Preferably, for the first embodiment of the handle, if the coating is of the metallic type, the first switching means is in the open position. And for the second embodiment of the handle, if the coating is of the metallic type, the first switching means is in the open position and the second switching means is in the closed position.

Advantageously,
   the first and second selection means are integrated into the control means and,
   the control means are connected to means of management of the vehicle, said management means comprising an information item relating to the type of coating.
The metallic coating is, for example, a coating containing chromium.

The invention also relates to a method for configuring a door handle of an automotive vehicle, the handle comprising:
   a first exterior surface directed toward the door and,
   a second exterior surface, opposite the first exterior surface and covered by a coating,
   a detection device comprising:
      a connection to the electrical ground,
      control means,
      an electrode connected to the control means and a face of which is situated in proximity to the first exterior surface,
      a conducting element connected to the connection to the electrical ground, a face of which is situated in proximity to the second exterior surface,
   the method comprising the following step:
      if the coating is of the metallic type, the link between the conducting element and the connection to the electrical ground is disconnected, in order to configure said handle as a function of the coating covering the second exterior surface.
In a second embodiment of the configuration method, the latter furthermore comprises the following step:
   if the coating is of the metallic type, the conducting element is connected to the electrode in order to configure said handle as a function of the coating covering the second exterior surface.

The invention also applies to any automotive vehicle comprising a door handle according to the characteristics enumerated hereinabove.

DETAILED DESCRIPTION OF THE INVENTION

Figure 1B:
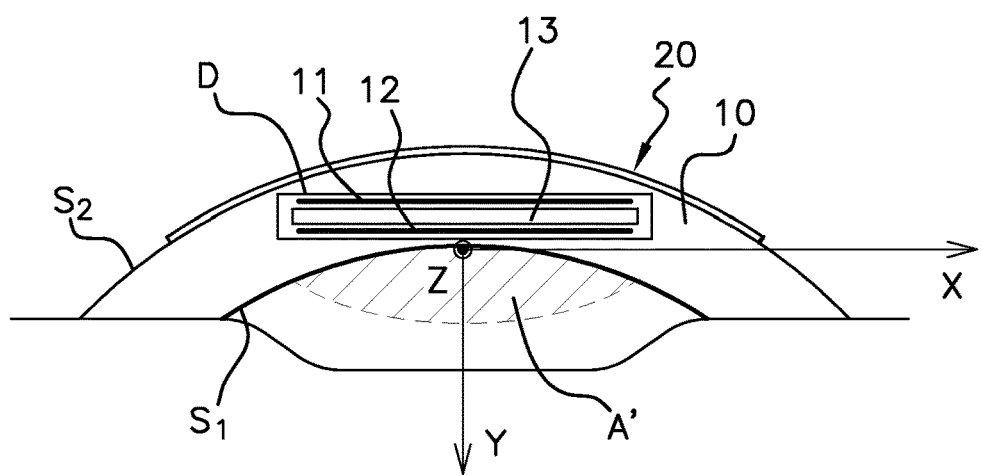
Figure 2:
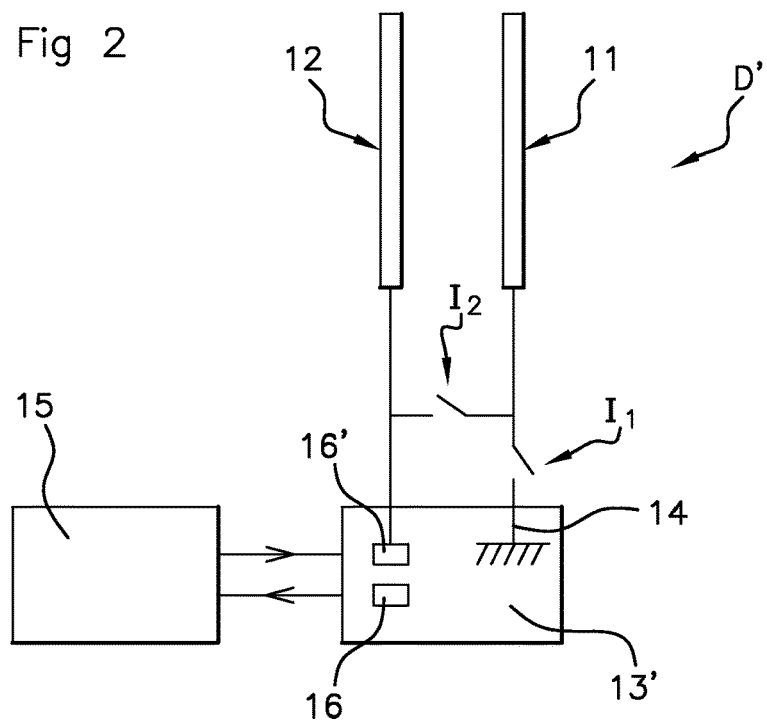
Figure 3:
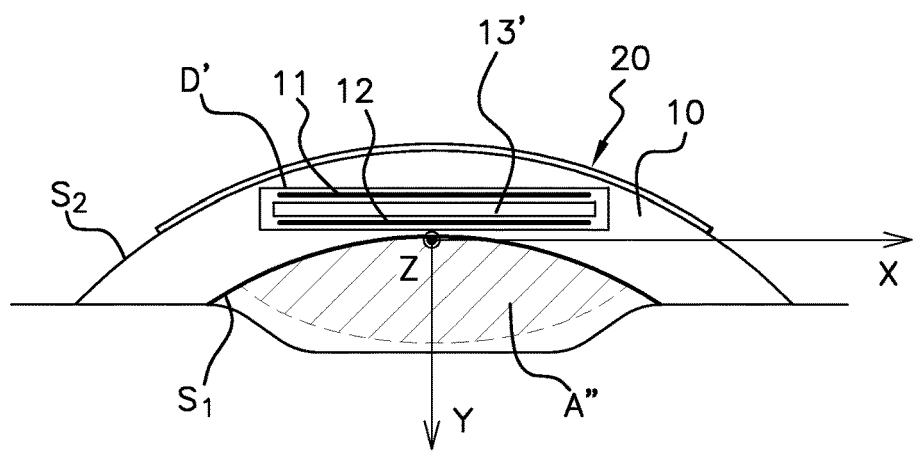

Other objects, characteristics and advantages of the invention will become apparent on reading the description which follows by way of nonlimiting example and on examining the appended drawings in which:

FIG. 1a, already explained previously, represents the detection device of the prior art with a coating of plastic type on the second exterior surface of the handle, FIG. 1b, already explained previously, represents the detection device of the prior art with a metallic coating on the second exterior surface of the handle, FIG. 2 represents the detection device according to the invention, FIG. 3 represents the detection device integrated into a handle according to the invention.

The device D' for detecting presence of a user according to the invention is illustrated in FIG. 2. In the subsequent description, and by way of example, said detection device D' is integrated into a door handle 10 of an automotive vehicle (cf. FIG. 3). However, the detection device D' can be integrated into any part of the vehicle's body shell, near which it is desired to detect the presence of a user and an exterior surface of which is apt to be covered with a coating of metallic type.

Said detection device D' comprises (cf. FIG. 2) a connection 14 connected to the electrical ground, control means 13', of the microcontroller and/or printed circuit type, an electrode 12 connected to the control means 13', and a conducting element 11 connected to the electrical ground by way of the connection 14 to the electrical ground. The connection 14 to the electrical ground can be a connection to the ground available in the control means 13' (for example the connection to the ground of the printed circuit).

In a first embodiment of the invention, the detection device D' furthermore comprises:
  a first switching means $I_1$ between the conducting element 11 and the connection 14 to the electrical ground, having a closed position in which the conducting element 11 is connected to the connection 14 to the electrical ground and an open position in which the conducting element 11 and the connection 14 to the electrical ground are disconnected,
  first means 16 for selecting the position of the first switching means $I_1$.

In a second embodiment, the detection device D' comprises inter alia:
  a second switching means $I_2$ between the conducting element 11 and the electrode 12, having a closed position in which the conducting element 11 is connected to the electrode 12 and an open position in which the conducting element 11 and the electrode 12 are disconnected, this second switching means $I_2$ (cf. FIG. 2) being of identical or different type from the first switching means $I_1$ (that is to say a breaker or a variable resistor for example),
  second means 16' for selecting the position of the second switching means $I_2$.

In a preferential embodiment, the detection device D' is integrated into a door handle 10 comprising:
  a first exterior surface S1 directed toward the door,
  a second exterior surface S2 directed to the opposite side, away from the first exterior surface S1, and covered by a coating,
and in which:
  a face of the electrode 12 is situated in proximity to the first exterior surface S1,
  a face of the conducting element 11 is situated in proximity to the second exterior surface S2.

The invention proposes to select the position of the first switching means $I_1$ of the detection device D' according to the coating covering the second exterior surface S2. Thus, if the coating is of the nonmetallic type, for example, plastic, more precisely a layer of nonmetallic paint P, then the first selection means 16 close the first switching means $I_1$. In this case, the conducting element 11 is connected to the electrical ground, for example, by way of the control means 13' and it operates as a shielding element.

If the coating is a coating of the metallic type 20, the first selection means 16 open the first switching means $I_1$. In this case, the conducting element 11 is no longer connected to the electrical ground. It is left "floating", and no longer operates as a shielding element. The electric field emitted by the electrode 12 then propagates freely up to the metallic coating 20 covering the second exterior surface S2. The metallic coating 20 then acts as a shielding element, thus avoiding the undesired detection of the presence of the user on the side of the handle where the second exterior surface S2 of the handle 10 is situated.

It will be understood that the advantage of the detection device D' according to the invention is to be able to select the function of the conducting element 11 as a function of parameters external to said device. In the example hereinabove, this entails the coating of the handle (metallic or nonmetallic). If the coating is of the nonmetallic type, for example, plastic, the conducting element 11 operates in the guise of shielding element, if the coating is of the metallic type, the conducting element 11 is left without electrical connection (or is connected to the electrode 12, this being explained below).

In a surprising manner, with the detection device D' of the invention, the unlocking zone A", situated between the first exterior surface S1 and the door, is then larger than that (A') of the prior art obtained with the same coating of metallic type 20. The order of magnitude of the increase in the dimensions of the unlocking zone A" with respect to that of the prior art A' is of the order of 55%, that is to say (A"−A')/A'=55%.

The dimensions of this unlocking zone A" are, in the three directions X, Y, Z, substantially equal to the dimensions of the unlocking zone A, of the prior art, obtained with a coating of nonmetallic type (plastic) P and the conducting element 11 connected to the electrical ground.

The speed of detection of the presence of the user in the unlocking zone is therefore substantially the same, whatever the type of coating, nonmetallic or metallic (P or 20), of the handle.

For the second embodiment of the detection device D', and in the case where the coating is a coating of metallic type 20, the invention proposes not only that the first selection means 16 open the first switching means $I_1$ but also that the second selection means 16' close the second switching means $I_2$. The shielding element 11 is then connected to the electrode 12 and operates as the electrode 12, that is to say it emits an electric field.

In this case, the dimensions, (in the three directions X, Y, Z), of the unlocking zone A''', situated between the first exterior surface S1 and the door, are also greater than the dimensions of the unlocking zone A', of the prior art, obtained with the same coating of metallic type 20. The order of magnitude of the increase in the dimensions of the unlocking zone A''' with respect to that of the prior art A' is of the order of 65%, that is to say (A'''−A')/A'=65%. The second embodiment therefore makes it possible to yet further magnify the unlocking zone with respect to the first embodiment.

The opening and the closing of the first and second switching means are carried out with the aid of the first and second selection means 16, 16' which can be situated in the control means 13'. These first and second selection means 16, 16' can consist of software.

The information item relating to the coating can be contained in the control means 13'. And the control means 13' for the detection device D' are connected to management means 15 (cf. FIG. 2), of the BCM (Body Controller Module) type or body shell control module, sited remotely on the vehicle. In these management means 15 are recorded various data relating to the vehicle, in this instance the type of vehicle, its identification number, etc. The coating, of nonmetallic type, for example, layer of plastic P or of metallic type 20, which covers the second exterior surface S2 of the handle is generally associated with the type of vehicle. Consequently, the information item on the coating of metallic or nonmetallic type (20 or P) of the second exterior surface S2 is known to the management means 15 and is dispatched by the latter to the first and second selection means 16, 16'. These latter then configure the first and the second switching means $I_1$ and $I_2$ in an appropriate manner as a function of the information item received relating to the coating.

The invention also relates to a method for configuring a door handle 10 of an automotive vehicle, the handle 10 comprising a first exterior surface S1 directed toward the door and a second exterior surface S2 directed toward the user and covered by a determined coating (P, 20), and comprising a detection device D' comprising:
 a connection 14 to the electrical ground,
 control means 13',
 an electrode 12 connected to the control means 13' and a face of which is situated in proximity to the first exterior surface,
 a conducting element 11, connected to the connection to the electrical ground a face of which is situated in proximity to the second exterior surface S2,
according to the invention, in a first embodiment of the configuration method, if the coating is of the metallic type 20, the link between the conducting element 11 and the connection 14 to the electrical ground is disconnected in order to configure said handle 10 as a function of the coating covering the second exterior surface S2.

In a second embodiment of the configuration method, if the coating is of the metallic type 20, in addition to disconnecting the link between the conducting element 11 and the connection 14, the conducting element 11 is furthermore connected to the electrode 12 in order to configure said handle 10 as a function of the coating covering the second exterior surface S2.

The method for configuring the handle can be carried out on the production line for making said device D'. In this case, a software tool, connected to the first and second selection means 16,16' of the device D', dispatches to them an information item relating to the coating of the second exterior surface S2 of the handle 10. And the first and second selection means, on receipt of this information item, select the position of the first and second switching means $I_1$ and $I_2$ in an appropriate manner.

It can also be envisaged to carry out the configuration method "manually", for example, in the case where the first and second switching means $I_1$ and bare resistors (of zero value in the case where the switching means is open, and of non-zero value if it is closed), it then suffices to place during assembly on the production line for making the detection device D', the resistor of appropriate value for the first and second switching means $I_1$ and $I_2$ as a function of the coating of the second exterior surface S2 of the handle 10 into which the device will be integrated. This is done in order to carry out the configuration of the desired handle 10, once and for all.

The invention therefore makes it possible to obtain a zone for detecting the presence of the user of substantially equal dimensions, whatever the coating (metallic or nonmetallic) covering the second exterior surface S2 of the handle 10. Consequently, when the handle is chromium-plated, there is no longer any delay in the detection of the presence of the user or any risk that his presence is not detected.

Of course, the invention is not limited to the embodiments described which are given only by way of example, in particular the device for detecting presence of a user can be integrated into other parts of the body shell of a vehicle that are apt to be covered with a metallic coating and around which it is desired to detect the presence of a user.

The invention claimed is:

1. A device (D') for detecting presence of a user, comprising:
 a connection to the electrical ground (14);
 an electrode (12);
 control means (13') of the electrode;
 a conducting element (11), connected to the connection to the electrical ground (14);
 a first switching means (I1) between the conducting element (11) and the connection to the electrical ground (14), said first switching means (I1) having a closed position in which the conducting element (11) is connected to said connection to the electrical ground (14) and an open position in which the conducting element (11) and said connection to the electrical ground (14) are disconnected;
 first selection means (16) for selecting the position of the first switching means (I1);
 a second switching means (I2) between the conducting element (11) and the electrode (12) having a closed position in which the conducting element (11) is connected to the electrode (12) and an open position in which the conducting element (11) and the electrode (12) are disconnected; and
 second selection means (16') for selecting the position of the second switching means (I2).

2. A door handle (10) of a door of a vehicle, comprising:
 a detection device (D') as claimed in claim 1;
 a first exterior surface (S1) directed toward the door; and
 a second exterior surface (S2) opposite the first exterior surface (S1) and covered by a coating (P, 20),
 wherein,
 a face of the electrode (12) is directed towards the first exterior surface (S1),
 a face of the conducting element (11) is directed towards the second exterior surface (S2), and
 if the type of coating is of metallic type (20), the first switching means (I1) is in the open position.

3. A door handle (10) of a door of a vehicle comprising:
a detection device (D') as claimed in claim 1;
a first exterior surface (S1) directed toward the door; and
a second exterior surface (S2) opposite the first exterior surface (S1) and covered by a coating (P, 20),
wherein,
- a face of the electrode (12) is directed towards the first exterior surface (S1),
- a face of the conducting element (11) is directed towards the second exterior surface (S2), and
- if the type of coating is of metallic type (20), the first switching means (I1) is in the open position and the second switching means (12) is in the closed position.

4. The door handle (10) as claimed in claim 2, wherein,
the first and second selection means (16, 16') are integrated into the control means (13'), and
the control means (13') are connected to means (15) of management of the vehicle, said management means (15) comprising an information item relating to the type of coating (P, 20).

5. The door handle (10) as claimed in claim 2, wherein the metallic coating (20) is a coating containing chromium.

6. The door handle (10), as claimed in claim 2, wherein,
the first and second selection means (16, 16') are integrated into the control means (13'), and
the control means (13') are connected to means (15) of management of the vehicle, said management means (15) comprising an information item relating to the type of coating (P, 20).

7. The door handle (10), as claimed in claim 3, wherein,
the first and second selection means (16, 16') are integrated into the control means (13'), and
the control means (13') are connected to means (15) of management of the vehicle, said management means (15) comprising an information item relating to the type of coating (P, 20).

8. The door handle (10) as claimed in claim 3, wherein the metallic coating (20) is a coating containing chromium.

\* \* \* \* \*